(12) United States Patent
De Luca et al.

(10) Patent No.: US 9,437,705 B2
(45) Date of Patent: Sep. 6, 2016

(54) METHOD OF MANUFACTURING A SPACER FOR DUAL GATE ELECTRONIC MEMORY CELL AND ASSOCIATED ELECTRONIC MEMORY CELL

(71) Applicant: COMMISSARIAT A L'ENERGIE ATOMIQUE ET AUX ENERGIES ALTERNATIVES, Paris (FR)

(72) Inventors: Anthony De Luca, Claix (FR); Christelle Charpin-Nicolle, Fontanil-Cornillon (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/341,171

(22) Filed: Jul. 25, 2014

(65) Prior Publication Data
US 2015/0031199 A1 Jan. 29, 2015

(30) Foreign Application Priority Data
Jul. 26, 2013 (FR) .................................. 13 57379

(51) Int. Cl.
| | |
|---|---|
| *H01L 29/51* | (2006.01) |
| *H01L 21/28* | (2006.01) |
| *H01L 21/3213* | (2006.01) |
| *H01L 29/423* | (2006.01) |
| *H01L 29/40* | (2006.01) |
| *H01L 29/66* | (2006.01) |
| *H01L 29/792* | (2006.01) |
| *H01L 21/311* | (2006.01) |
| *H01L 21/00* | (2006.01) |

(52) U.S. Cl.
CPC ......... *H01L 29/51* (2013.01); *H01L 21/28282* (2013.01); *H01L 21/31116* (2013.01); *H01L 21/32132* (2013.01); *H01L 21/32137* (2013.01); *H01L 29/401* (2013.01); *H01L 29/42344* (2013.01); *H01L 29/42368* (2013.01); *H01L 29/66833* (2013.01); *H01L 29/7923* (2013.01)

(58) Field of Classification Search
None
See application file for complete search history.

(56) References Cited

U.S. PATENT DOCUMENTS

| | | | | |
|---|---|---|---|---|
| 6,251,764 | B1 * | 6/2001 | Pradeep et al. | 438/595 |
| 7,229,869 | B2 * | 6/2007 | Yoon et al. | 438/197 |
| 8,101,477 | B1 * | 1/2012 | Power | 438/201 |
| 2003/0075778 | A1 * | 4/2003 | Klersy | 257/536 |
| 2005/0026382 | A1 * | 2/2005 | Akatsu et al. | 438/386 |

(Continued)

OTHER PUBLICATIONS

Shum, D., et al., "Highly Reliable Flash Memory with Self-aligned Slit-gate Cell Embedded into High Performance 65nm CMOS for Automotive & Smartcard Applications," IEEE, 2012, 4 pgs.

(Continued)

*Primary Examiner* — Evren Seven
(74) *Attorney, Agent, or Firm* — Pillsbury Winthrop Shaw Pittman LLP

(57) ABSTRACT

A method of manufacturing a spacer for an electronic memory including a substrate; a first gate structure; a stack including a plurality of layers whereof at least one of the layers is able to store electric charges, the method including depositing a spacer material layer, at least on the area covered by the stack; ion beam machining the spacer material layer, the ion beam machining being carried out with controlled stopping so as to preserve a residual portion of the thickness of the spacer material layer covering the stack; plasma etching the residual portion of the thickness of the spacer material layer.

10 Claims, 4 Drawing Sheets

(56) References Cited

U.S. PATENT DOCUMENTS

| | | | |
|---|---|---|---|
| 2005/0087775 A1* | 4/2005 | Chen et al. | 257/262 |
| 2007/0215930 A1* | 9/2007 | Machida et al. | 257/314 |
| 2008/0157131 A1* | 7/2008 | Singh et al. | 257/288 |
| 2009/0152234 A1* | 6/2009 | Guthrie et al. | 216/22 |
| 2009/0215264 A1* | 8/2009 | Yu et al. | 438/675 |
| 2009/0246960 A1 | 10/2009 | Kim | |
| 2010/0074821 A1* | 3/2010 | Grant | 423/240 S |
| 2010/0078736 A1* | 4/2010 | Hoentschel et al. | 257/408 |
| 2011/0070726 A1* | 3/2011 | Dickenscheid et al. | 438/591 |
| 2011/0186914 A1* | 8/2011 | Cheng et al. | 257/288 |
| 2012/0156849 A1* | 6/2012 | Yu | 438/381 |
| 2012/0261672 A1* | 10/2012 | Chidambarrao et al. | 257/77 |
| 2013/0001669 A1 | 1/2013 | Lin | |
| 2014/0291283 A1* | 10/2014 | Braganca et al. | 216/16 |
| 2014/0306289 A1* | 10/2014 | Basker et al. | 257/368 |
| 2015/0041925 A1* | 2/2015 | Zhu et al. | 257/411 |

OTHER PUBLICATIONS

Search Report and Written Opinion issued for French Patent Application No. 1357379, dated Mar. 21, 2014.

* cited by examiner

METHOD OF MANUFACTURING A SPACER FOR DUAL GATE ELECTRONIC MEMORY CELL AND ASSOCIATED ELECTRONIC MEMORY CELL

CROSS-REFERENCE TO RELATED APPLICATIONS

This application claims priority to French Patent Application No. 1357379, filed Jul. 26 2013, the entire content of which is incorporated herein by reference in its entirety.

FIELD

The technical field of the invention is that of manufacturing methods of dual gate (storage transistor gate and control transistor gate) memory cells having a "split-gate" architecture. In a split-gate dual-gate electronic memory cell, the storage transistor gate may be made in the form of a spacer of the control transistor gate, arranged against one of the two lateral flanks of the control transistor gate. Such electronic memory cells find an application which is of particular interest in the field of embedded electronics.

The field of the invention relates more particularly to the methods for manufacturing spacers for dual gate electronic memory cells.

BACKGROUND

The standard manufacture of spacers using dry etching is a technique that is widely used in microelectronics. This technique allows reproducible results to be achieved, and combines the ability to achieve relatively straight etching profiles with the achievement, in general, of good etching "selectivities", that is, the ability to stop on another material without excessive consumption of the latter. On the other hand, it does not allow large volume spacers to be obtained, nor does it allow the width of said spacers to be controlled. The document "Highly Reliable Flash Memory with Self-aligned Split-gate Cells Embedded into High Performance 65 nm CMOS for Automotive and Smartcard Applications" ((IMW2012) by D. Shum et al.) states that the spacer profile obtained by using conventional microelectronics methods is substantially triangular. A spacer with such a triangular profile has two main drawbacks:

The thickness of the spacer is insufficient at the edge of the triangular patterns, and doping of the drain is therefore not very well controlled. Ideally, a square spacer would be required that is sufficiently thick to avoid potential counter-doping.

The width and the silicidation volume at the top of the spacer are small and making of contacts is difficult to accomplish.

Such a structure is illustrated in FIG. 1, which schematically shows a dual gate memory cell 1 with a split-gate architecture wherein the storage transistor gate is made in the form of a spacer of the control transistor gate.

The memory 1 comprises a substrate 2 made from a semi-conductor material, a control transistor gate conductive area 3 which has a lateral flank 4 and a lateral spacer 5 arranged against the lateral flank 4 of the control transistor 3. This lateral spacer 5 in particular comprises:

a three-layer dielectric stack 6, for example of oxide-nitride-oxide (called an ONO stack), where the nitride layer stores electric charges;

a conductive area of the storage transistor gate 7 with a substantially triangular shape.

With such a structure, however, it is very difficult to subsequently make a point of electrical contact on the conductive area of the storage transistor 7: the accessible area for making a contact is very small. Moreover, at the edge of the spacer the thickness of the conductive area of the storage transistor gate 7 is very small and poorly controlled; the drain doping area itself will therefore be poorly controlled.

Document US20110070726A1 proposes a method of manufacturing a spacer whose shape is not triangular. According to this manufacturing method, a protective material is deposited on the material of the spacer prior to the etching of the spacer. The protective material can contain carbon; it may also be a dielectric with, for example, an oxide or nitride base, such as silicon nitride. The protective material may be highly selective relative to the spacer material. This protective material contributes to the achievement of a spacer which has a non-triangular form and whose lateral flanks are substantially vertical. The manufacturing method proposed by document US20110070726A1 requires a chain of supplementary technological steps, however, which makes it more complex and costly.

SUMMARY

In an aspect of the invention, there is provided a method that offers a solution to the problems mentioned previously, by allowing a dual gate (control transistor gate and storage transistor gate) electronic memory cell to be achieved, wherein the storage transistor gate is made in the form of a spacer of the control transistor gate, said spacer having a significant volume of material, by a method which is simpler (not requiring recourse to depositions of other materials) and therefore less costly than those proposed in the state of the art.

A first aspect of the invention relates to a method of manufacturing a spacer for an electronic memory, the electronic memory comprising:

a substrate which extends along a reference plane;

a first gate structure deposited on the substrate, the first gate structure having at least one lateral flank;

a stack comprising a plurality of layers whereof at least one of said layers is able to store electric charges, said stack covering at least the lateral flank of the first gate structure and a portion of the substrate;

where said method of manufacturing the spacer comprises:

deposition of a spacer material layer at least on the area covered by the stack;

ion beam machining of the spacer material layer, said ion beam machining being carried out with controlled stopping, so as to preserve a residual portion of the thickness of the spacer material layer covering the stack;

plasma etching of the residual portion of the thickness of the spacer material layer, called the "first plasma etching".

The method according to an embodiment of the invention beneficially combines two successive etchings with different properties, for the manufacture of a spacer of an electronic memory which has a controlled length and which possesses a significant volume of material, while allowing a reduction in the complexity and therefore in the cost of manufacture.

The method according to an embodiment of the invention first of all makes good use of the highly anisotropic character of ion beam machining, which allows the shape and volume of the spacer material initially deposited, and which laterally covers the deposited stack, to be preserved in a manner which is much more satisfactory than by using, for example, a dry etching technique, as conventionally used in the prior art. Ion-beam machining results in significant re-deposition on the etched thicknesses and in rough surfaces which are incompatible with the surface finish expected in microelectronics. It is thus regarded as being inappropriate by those skilled in the art. Moreover, it does not allow good selectivity between the various layers of materials, which renders it a priori unusable in the manufacture of the critical parts of a transistor.

The method according to an embodiment of the invention then terminates the etching of the residual portion of the thickness of the spacer material layer with a first plasma etching. The method beneficially uses the selective character of such an etching in order not to cut into the stack. Moreover, the first plasma etching beneficially allows the surface finish previously obtained by ion beam machining to be improved.

In this document the term "residual portion of the thickness of a layer A" should be taken to mean a residual thickness of the layer A which persists after the rest of the thickness of layer A has been etched by ion beam machining and which is typically less than half the initial thickness of the layer A.

In this document, unless otherwise stated, the term "spacer" is used without prejudging whether said spacer is insulating or conductive.

Besides the characteristics which have just been stated in the preceding paragraph, the method according to an embodiment of the invention may comprise one or more additional characteristics from amongst the following, considered individually or according to the technically possible combinations:

- The deposited layer of the spacer material is a layer of doped amorphous silicon or doped polycrystalline silicon. More generally, the deposited layer may be made up of other types of semi-conductive materials, for example a material based on Ge or a mixture of Si and Ge. Also, in certain configurations a metal such as TiN may be deposited just before the semiconductor material in order to increase the work function.
  Thus the spacer material(s) is/are compatible with an electronic memory cell gate material. The spacer thus made can contribute towards the formation of a second gate structure of a dual-gate electronic memory cell, the second gate structure being made in the form of a spacer of the first gate structure.
- The deposition of the layer of spacer material is carried out over a thickness which is substantially between $0.75*e_1$ and $3*e_1$, where e1 is the height of the first gate. For example, if $e_1=50$ nm then the thickness of the spacer that may reasonably be deposited will substantially be between 38 nm and 150 nm.
  Thus the width of the spacer that is made later can be chosen.
- The ion beam machining used is an ion beam machining with Argon.
  Thus an inert gas commonly associated with a fully controlled method is used in a new context, therefore resulting in no additional costs.
- The ion beam machining used has an incidence of 40° relative to the reference plane of the substrate.
  Thus a normal incidence parameter of a fully controlled method is used in a new context, therefore resulting in no additional costs.
- At the end of ion beam machining, the residual portion of the thickness of the gate material layer of the second gate structure has a thickness of between 15 nanometers and 20 nanometers.
  Thus the thickness of the residual portion is both sufficient to allow end-point detection to operate, and small enough for the first plasma etching step to be of short duration. Indeed the observation of an end-point detection ensures the selectivity of the first plasma etching used in the method after the ion beam machining step. At the same time, the first plasma etching responsible for the removal of the thickness of the residual portion is as rapid as possible in order not to cut into the spacer material which laterally covers the stack. Indeed, if the thickness of the residual portion to be removed with the first plasma etching is too great, the benefits of the ion beam etching step are lost and the final shape of the spacer will be affected by this, that is, a quasi-triangular spacer shape will be obtained.
- The method has, subsequent to the first plasma etching, a second plasma etching of the stack that is not covered by the spacer material after the first plasma etching, said second plasma etching being carried out as selectively as possible relative to the spacer material, so as not to etch the spacer material, or so as to etch it as little as possible.
  Thus a contribution is made to allowing a contact to be subsequently made on the first gate structure.
- The second plasma etching is carried out in a direction which is substantially perpendicular to the reference plane, so as to preserve the form and volume of the spacer material which laterally covers the stack.
  Thus the benefits of ion beam machining and of the first plasma etching are retained.
- The second plasma etching involves etching using a fluorine-containing plasma, without Argon and diluted with Helium.
  Thus a plasma is obtained which is sufficiently anisotropic and selective between the stack and the gate material. Indeed the prior art only proposes standard etching, based on chlorine compounds, which are selective but somewhat isotropic. This results in lateral etching of the spacer material which laterally covers the stack and thus a triangular profile is obtained for this spacer. The use of a fluorine-containing plasma with Argon would improve the anisotropy of the etching and therefore reduce the lateral etching of the spacer material. This, however, would in return result in low selectivity of the etching in relation to the spacer material. The method according to an embodiment of the invention therefore proposes a second plasma etching based on fluorine-containing compounds, without Argon and highly diluted with Helium in order to increase the selectivity of the second plasma etching in relation to the spacer material and prevent lateral etching of it.
- The plasma used in the second plasma etching is a mixture of difluoromethane, helium and oxygen, with twice as much helium as oxygen and four times more difluoromethane than oxygen.

A second aspect of the invention relates to a method of manufacturing an electronic memory cell comprising:
  a substrate which extends along a reference plane;
  a first gate structure deposited on the substrate, where the first gate structure has at least one lateral flank;
  a stack comprising a plurality of layers whereof at least one of said layers is able to store electric charges, said stack covering at least the lateral flank of the first gate structure and a portion of the substrate;

a second gate structure, insulated from the first gate structure and from the substrate by the stack, the second gate structure being a spacer of the first gate structure;

where the manufacture of the second gate structure comprises a method for manufacturing a spacer according to the invention.

The invention and its various applications will be better understood on reading the following description and on examination of the figures which accompany it.

BRIEF DESCRIPTION OF THE FIGURES

The figures are given for indication purposes and are in no way intended to limit the invention.

DETAILED DESCRIPTION

For improved clarity, identical or similar elements are identified by the same reference signs in all figures.

A method 100 for manufacturing an electronic memory cell according to a first embodiment of the invention is shown in FIGS. 2, 3a to 3d and 4.

A method 100' for manufacturing an electronic memory cell according to a second embodiment of the invention is shown in FIGS. 2, 3a to 3d and 5a to 5d.

Figure 1:
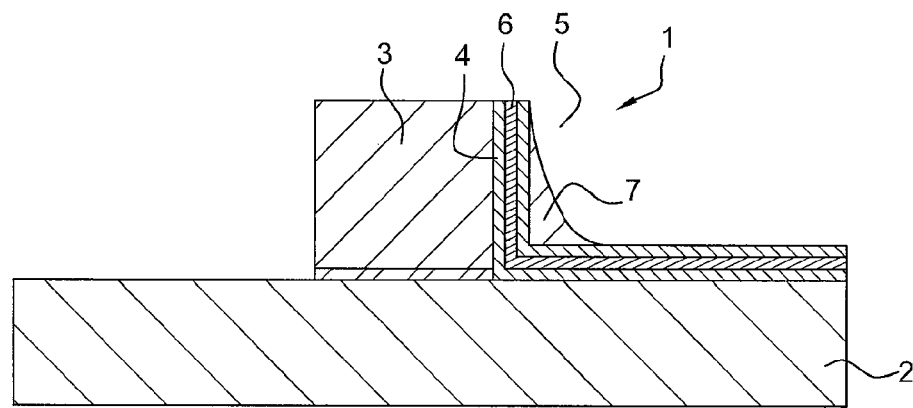
FIG. 1 schematically shows an example of a dual gate memory cell according to the state of the technique.
Figure 2:
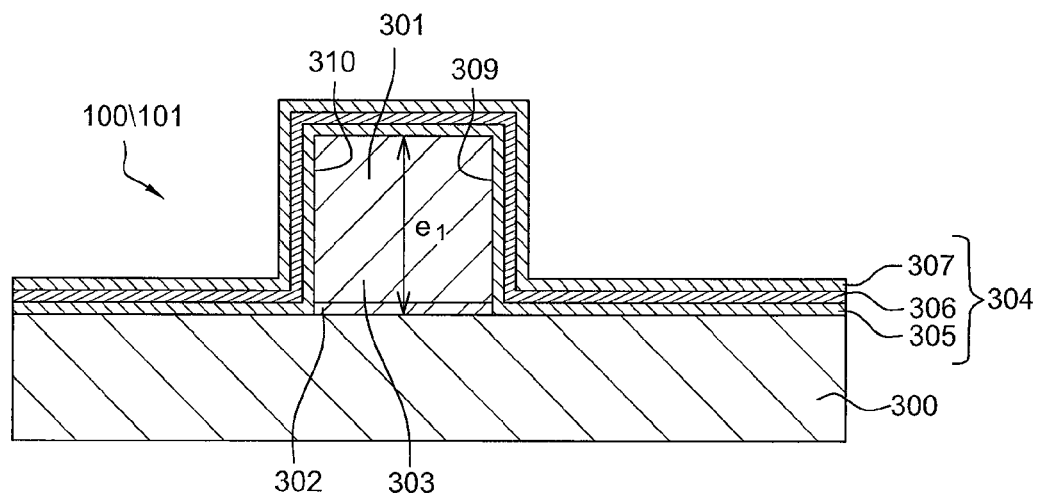
FIG. 2 shows a first step of a method for manufacturing an electronic memory cell according to an embodiment of the invention.

A first step 101 in the method 100 is shown in FIG. 2. According to the first step 101, first of all a first gate structure 301, called the select transistor gate or control transistor gate, is manufactured on a substrate 300. The semi-conductor material of the substrate 300 is, in the example shown, silicon. The substrate 300 extends along a reference plane. The first gate structure 301 has a first lateral flank 309 and a second lateral flank 310. The first gate structure 301 has a thickness e1 measured in a direction perpendicular to the plane of reference of the substrate. This thickness e1 is typically between 50 nanometers and 150 nanometers. The first gate structure 301 is composed of a gate dielectric layer 302 and of a conductive layer 303. The gate dielectric layer 302 may be made by thermal oxidation of the semi-conductor material forming the substrate 300. The conductive layer 303 is made, for example, of polysilicon. The deposition of a stack 304 comprising a plurality of layers, whereof at least one layer is able to store electric charges, is then carried out. In the example shown, the stack 304 is a three-layer oxide-nitride-oxide stack, called ONO. The stack 304 is formed of a first dielectric layer 305, made for example of silicon dioxide $SiO_2$, of a second layer 306 made from a material able to store electric charges, for example silicon nitride $Si_3N_4$, and of a third dielectric layer 307, for example made of silicon dioxide $SiO_2$. The second layer 306 may also be a layer constituted of silicon nanocrystals. The deposition of the stack 304 is carried out so as to cover the first gate structure 301.

Figure 3A:
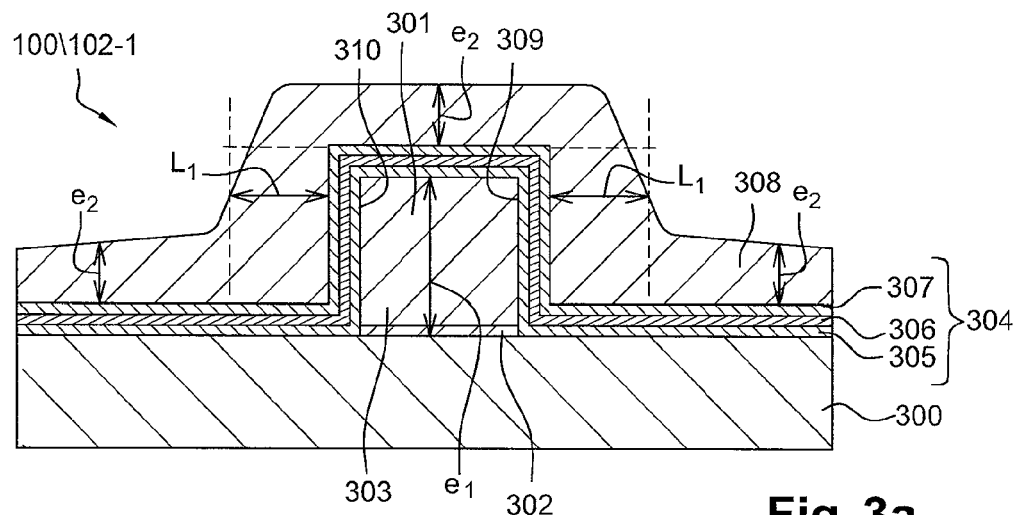
FIGS. 3a to 3c show the steps of a method for manufacturing spacers for electronic memory cells according to an embodiment of the invention.
Figure 3B:
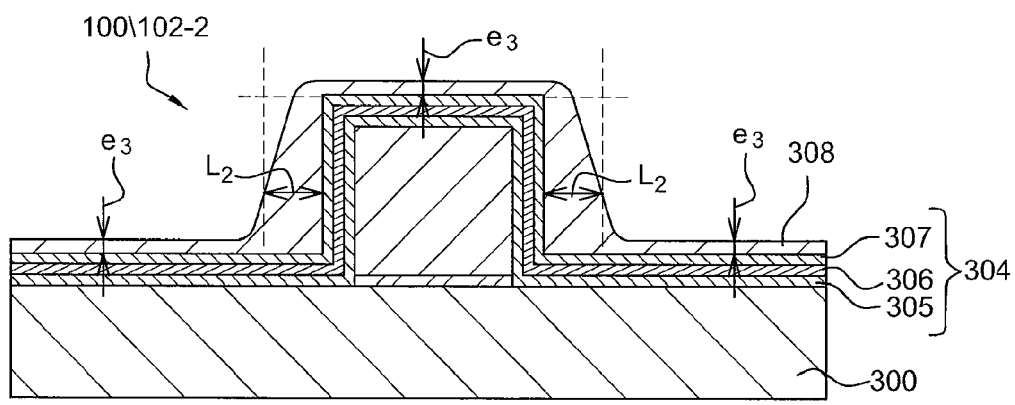
Figure 3C:
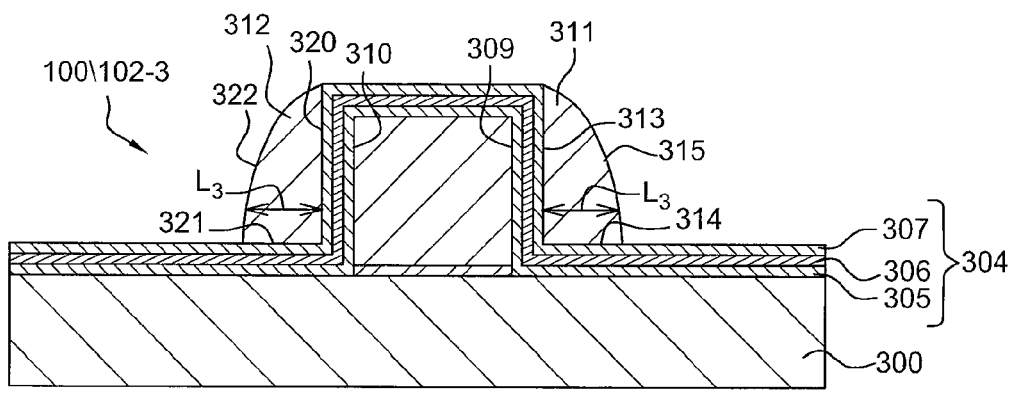

A second step 102 in the method 100 is shown in FIGS. 3a to 3c. The second step 102 is a spacer manufacturing step which comprises three sub-steps:

a first sub-step 102-1 is shown in FIG. 3a;
a second sub-step 102-2 is shown in FIG. 3b;
a third sub-step 102-3 is shown in FIG. 3c.

According to the first sub-step 102-1, shown in FIG. 3a, the deposition of a layer 308 of the spacer material is carried out, for example by using LPCVD ("Low Pressure Chemical Vapour Deposition").

The spacer material corresponds in the example shown to a gate material of a second gate structure, for example doped polycrystalline or amorphous silicon. This deposition of the layer 308 is carried out so as to cover the previously deposited stack 304. The layer 308 has a thickness e2 measured in a vertical direction, substantially perpendicular to the plane of reference of the substrate, and a length L1 measured along a horizontal direction, substantially perpendicular to the lateral flanks 309 and 310 of the first gate structure 301. The length L1 is linked to the length of the spacer subsequently created: ideally the length of the spacer obtained is equal to L1. The thickness e2 and the length L1 have the same order of magnitude and are typically between $0.75*e_1$ and $3*e_1$. The greater the degree of conformance of the deposit, the closer the thickness e2 is to the length L1.

According to the second sub-step 102-2, illustrated in FIG. 3b, the ion beam machining of a portion of the thickness e2 of layer 308 is carried out. The desired effect is that at the end of this second sub-step 102-2 a length L2 of the gate material laterally covering the stack 304 is obtained which is as controlled as possible. The length L2 is necessarily less than or equal to the length L1. The etching technique chosen is therefore beneficially the most anisotropic possible: the more anisotropic the etching technique chosen, the better is the preservation of the gate material laterally covering the stack 304 and the closer L2 is to L1.

Ion beam machining allows the portions of the layer 308 which are parallel to the plane of reference of the substrate to be those primarily etched, while etching much less of the portions of the layer 308 which are perpendicular to the plane of reference of the substrate. The high anisotropy of ion beam machining beneficially allows the shape and the volume of the gate material of the layer 308 laterally covering the stack 304 to be preserved much more satisfactorily than by using, for example, a less anisotropic dry etching technique as is conventionally used in the state of the art.

The stopping of the ion beam machining is controlled so as to preserve a residual portion e3 of the thickness e2 of the layer 308 of the gate material covering the stack 304, in a direction which is substantially parallel to the plane of reference and so as not to etch the stack 304. This residual portion e3 is beneficially between 15 nanometers and 20 nanometers thick. We will return later in this document to the selection of the thickness of the residual portion.

In the example shown, the ion beam machining used is ion beam machining using Argon (Ar), used under standard machining conditions, with a current of 100 mA and an incidence of 40° relative to the plane of reference of the substrate. Under these machining conditions, the speed of machining of the polycrystalline silicon is between 12 and 13 nanometers per minute. Typically, in the case where it is wished to retain a residual portion e3 of polycrystalline silicon which is between 15 and 20 nanometers thick, the indicative ion beam machining times required are as follows:

- 4 minutes for an initial deposit of a layer 308 of polycrystalline silicon where e2=65 nanometers;
- 5 minutes and 50 seconds for an initial deposit of a layer 308 of polycrystalline silicon where e2=90 nanometers;
- 9 minutes for an initial deposit of a layer 308 of polycrystalline silicon where e2=130 nanometers;

According to the third sub-step 102-3, illustrated in FIG. 3c, a first plasma etching of the residual portion e3 of the thickness e2 of the layer 308 of the spacer material is carried out. At the end of this first plasma etching, the residual portion e3 is removed. The first plasma etching is carried out in a direction which is substantially perpendicular to the reference plane, so as to preserve as much as possible of the form and volume of the gate material of the layer 308 which laterally covers the stack 304. This first plasma etching is carried out selectively relative to the stack 304, so as not to etch the stack 304. The first plasma etching is, in the embodiment described here, carried out in an inductively coupled plasma (ICP) reactor. This type of reactor allows the physical and chemical components of the plasma to be adjusted in order to optimise the selectivity between materials during plasma etching.

We will return at this point to the choice of the thickness of the residual portion e3. The selectivity of the plasma dry etching process is achieved using etching end point detection. In the case of a spacer material and therefore of a residual portion e3 made of polycrystalline silicone, a native oxide layer forms on the surface as soon as the spacer material is exposed to atmospheric air. The thickness of the residual portion e3 is sufficient for the etching end point detection to determine the passage from this native oxide to the polycrystalline silicon of the gate materials, and then passage from the polycrystalline silicon to the dielectric gate material of the layer 307. At the same time the thickness of the residual portion e3 is sufficiently small for the first plasma etching used to remove it to be rapid and not cut into the spacer material laterally covering the stack 304. If the thickness of the residual portion e3 is too great, the benefit of the first ion beam machining step is lost. In practice, a thickness of 15 to 20 nanometers for the residual portion e3 allows the etching end point detection to work correctly and also ensures that the second plasma etching step is of short duration.

First the native oxide is removed. This may be carried out in a few seconds by using a plasma of 100 sccm (standard cubic centimeters per minute) of carbon tetrafluoride $CF_4$ at a pressure of 4 mTorr with a power of 350 Watt at the coil and a 50 Watt "bias". The thickness of the residual portion e3 is then removed using a mixture of hydrogen bromide, chlorine and carbon tetrafluoride at a pressure of 4 mTorr with a power of 450 Watts at the coil and a bias of 70 Watt. By means of this method, at the end of the first plasma etching a lateral etching of the spacer material laterally covering the stack 304 of less than 6 nanometers is observed. Therefore at the end of this first plasma etching a length L3 of the spacer material laterally covering the stack 304 is achieved such that: L3≥L2−6 nanometers. It is therefore possible to control the length L3 of the spacers finally made as a function of the length L1 of the layer 308 that is initially deposited.

The residual spacer material which initially constituted the layer 308 now forms a first spacer 311 and a second spacer 312 of the first gate structure 301. The first spacer 311 and the second spacer 312 have a length L3.

The first spacer 311 obtained at the end of this third sub-step 102-3 comprises:
- a first lateral face 313, substantially perpendicular to the plane of reference of the substrate and in contact with the stack 304 such that the stack 304 separates the first lateral flank 309 of the first gate structure 301 and the first lateral face 313.
- a lower face 314 of length L3, substantially parallel to the plane of reference of the substrate and in contact with the stack 304 such that the stack 304 separates the substrate 300 and the lower face 314.
- a second rounded lateral face 315, linking the first lateral face 313 and the lower face 314.

The second spacer 312 obtained at the end of this third sub-step 102-3 of the method 200 comprises:
- a first lateral face 320, substantially perpendicular to the plane of reference of the substrate and in contact with the stack 304, such that the stack 304 separates the first lateral flank 310 of the first gate structure 301 and the first lateral face 320;
- a lower face 321 of length L3, substantially parallel to the plane of reference of the substrate and in contact with the stack 304, such that the stack 304 separates the substrate 300 and the lower face 314.
- a second rounded lateral face 322, linking the first lateral face 320 and the lower face 321.

Figure 4:
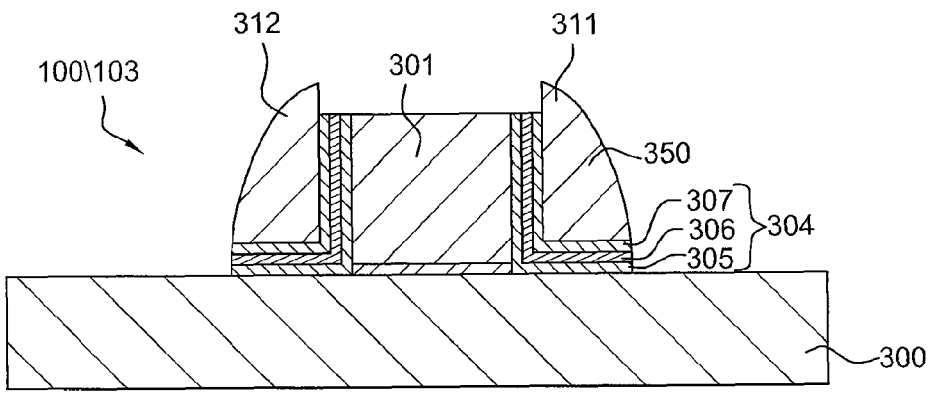
FIG. 4 shows a step of a method for manufacturing an electronic memory cell according to a first embodiment of the invention.

A third step 103 of the method 100 is shown in FIG. 4. According to the third step 103, a second plasma etching is carried out in order to eliminate the stack 304 which is not covered by the residual spacer material forming the spacers 311 and 312. Thus a contribution is made in particular to allowing a later point of contact to be made on the first gate structure 301 and on the source and drain areas. This second plasma etching is carried out selectively relative to the material of spacers 311 and 312 in order to preserve a large volume of material for these spacers 311 and 312 and in order not to damage the shape of these spacers, or to damage them as little as possible. To do this, the prior art proposes standard, chlorine-based, rather isotropic etchings, which would result in lateral etching of spacers 311 and 312 and the appearance of a triangular profile for said spacers 311 and 312. The use of a fluorine-containing plasma with Argon would improve the anisotropy of the etching and therefore reduce the lateral etching of the spacers 311 and 312. This, however, would in return result in low selectivity of the second plasma etching relative to the material of spacers 311 and 312. The method according to an embodiment of the invention proposes carrying out a second plasma etching based on fluorine compounds, without Argon and with high dilution with Helium in order to increase the selectivity relative to the spacer material and to avoid lateral etching of the spacers 311 and 312. Thus a mixture of difluoromethane, of helium and of oxygen in the following proportions: 4/2/1, that is, four times more difluoromethane than oxygen and twice as much helium as oxygen, at a pressure of 4 mTorr, with a coil power of 150 Watt and a bias power of 70 Watt, can be used to obtain a plasma that is sufficiently anisotropic and selective between the gate dielectric of layer 305 and the silicon. Various trials between 20 Watt and 110 Watt bias were used to optimise this selectivity to 5.7 between the nitride and the polysilicon and to 1.28 between the oxide and the polysilicon. Spacers 311 and 312 with a length L3 of 70, 90 and 120 nanometers have thus been made for a first gate structure with a thickness e1 of 50 nanometers then with a thickness e1 of 150 nanometers.

Now the method 100' for manufacturing an electronic memory cell according to the second embodiment of the invention will be described. The method 100' allows an electronic memory cell to be obtained with a single spacer. The method 100' comprises the first step 101 and the second step 102 described above. Following the second step 102, the method 100' comprises a third alternative step 103', then fourth, fifth and sixth steps 104', 105' and 106', shown respectively in FIGS. 5a to 5d.

Figure 5A:
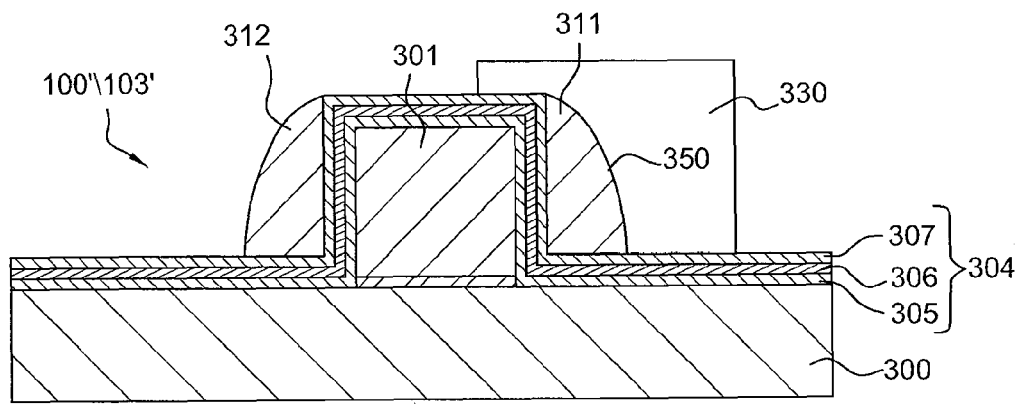
FIGS. 5a to 5d show certain steps in a method for manufacturing an electronic memory cell according to a second embodiment of the invention.

The third alternative step 103' of the method 100' is shown in FIG. 5a. According to the third alternative step 103', a protective resin 330, for example a photosensitive resin, is deposited on the spacer 311 and on a portion of the first gate structure 301. The spacer 312 not protected by the resin 330 is removed, for example by means of reactive ion etching (RIE). The protective resin 330 is then removed in turn, for example using a resin removal method (stripping). In this second embodiment of the invention where the second spacer 312 is removed and where only the first spacer 311 is preserved, the first spacer 311 beneficially contributes to forming a second gate structure 350 of the electronic memory cell.

Figure 5B:
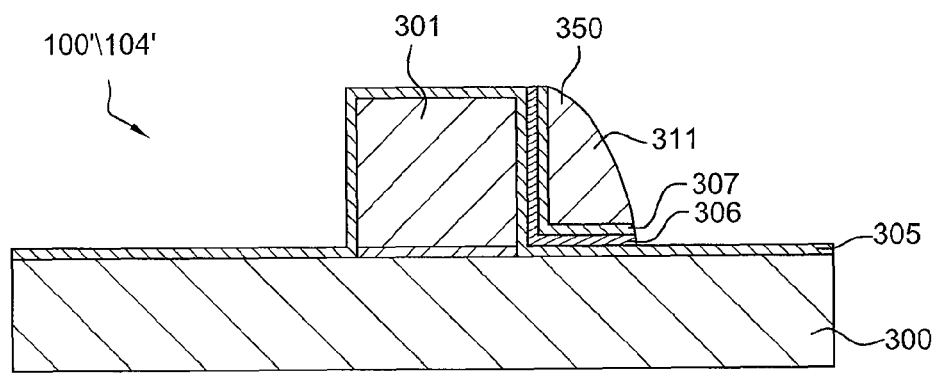

The fourth step 104' of the method 100' is shown in FIG. 5b. According to the fourth step 104', the third layer 307 and the second layer 306 of the stack 304 which are not covered by the spacer 311 are removed, with stopping on the first layer 305. Only etching of the third layer 307 and of the second layer 306 is carried out, with stopping on the first layer 305, for reasons involving stopping of the etching and of implantation, details of which will be given below. In the case of an ONO-type stack 304, this removal may be carried out by a dry etch technique such as reactive ion etching (RIE), with stopping on the first layer 305 of SiO$_2$.

The fourth step 104' may then comprise a first ion implantation (not shown). This step generally comprises doping of the LDD ("Lightly Doped Drain") type which in particular is used to achieve medium-dose doping of the surface of the spacer 311. Depending on whether it is desired to make a transistor of the PMOS type or of the NMOS type, the ions are chosen in such a way as to create areas of p or n type conductivity. It can therefore be understood why only etching of the third layer 307 and the second layer 306 is carried out initially:

First of all the first layer 305 acts as a stop layer: slight consumption of said first layer 305 poses no problems since the intention is to remove it.

Then the presence of a few nanometers of material due to the first layer 305 allows implantation to be carried out without damaging the substrate 300. The first layer 305 will be damaged by the implantation, but this does not pose a problem since it is subsequently to be removed.

Figure 5C:
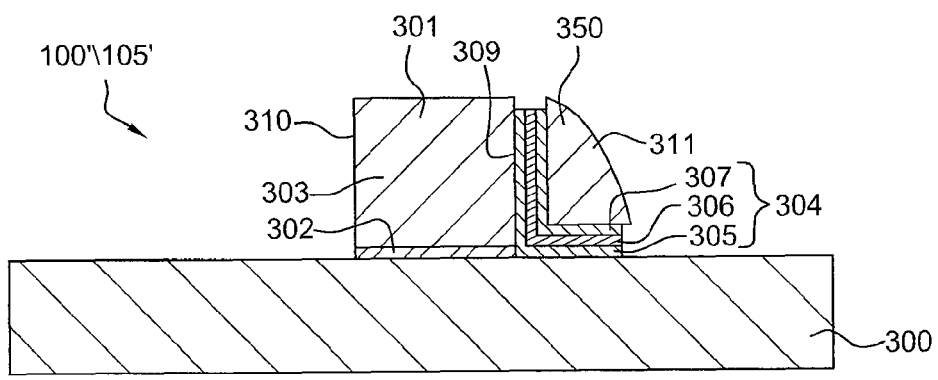

The fifth step 105' of the method 100' is shown in FIG. 5c. According to the fifth step 105', the removal of the first layer 305 of the ONO stack 304 is carried out. This removal is achieved, for example, by isotropic wet etching with a partially diluted solution of hydrofluoric acid (HF) so as to achieve good selectivity of removal of SiO$_2$ forming the layer 305, relative to the substrate 300 (here a silicon substrate). The removal of the first layer 305 of the stack 304 can also be achieved by the previously described technique of plasma etching based on fluorine-containing compounds, without Argon and with a high dilution of Helium, in order to increase selectivity relative to the spacer material and to prevent lateral etching of the spacer 311. Said plasma etching technique uses a mixture of difluoromethane, of helium and of oxygen in the following proportions: 4/2/1, that is, four times more difluoromethane than oxygen and twice as much helium as oxygen, at a pressure of 4 mTorr, with a coil power of 150 Watt and a bias power of 70 Watt, which can be used to obtain a plasma that is sufficiently anisotropic and selective between the gate dielectric of layer 305 and the silicon.

Figure 5D:
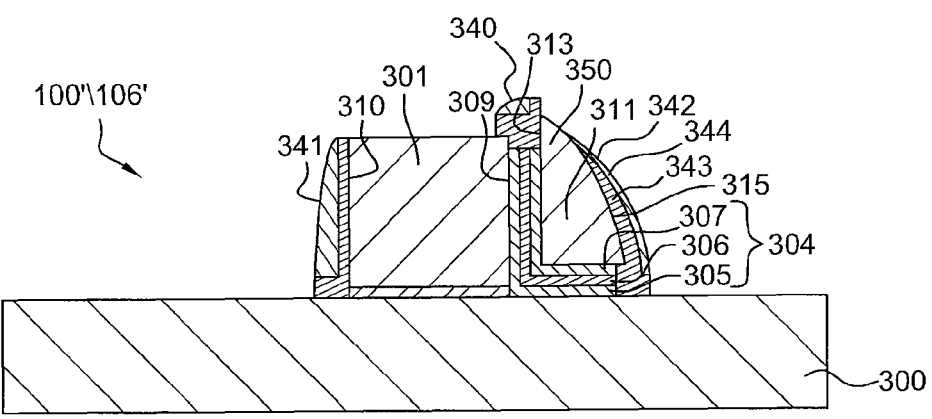

The sixth step 106' of the method 100' is shown in FIG. 5d. According to the sixth step 106', various insulating regions of the electronic memory cell are created, namely:

a first insulating region 340 which extends over the portion of the lateral face 313 of the spacer 311 which is not in contact with the stack 304;

a second insulating region 341 which extends over the second lateral flank 310 of the first gate structure 301;

a third insulating region 342 which extends over the second lateral face 315 of the spacer 311.

Each of these insulating regions 340, 341 and 342 is formed of a dielectric material, which may be, for example, a double oxide/nitride layer, for example a High Temperature Oxide (HTO) SiO$_2$ layer and a layer of Si$_3$N$_4$. In order to do this, first of all a first layer 343 of so-called HTO oxide is deposited, achieved, for example, using low pressure chemical vapour deposition (LPCVD). Typically a thickness of 10 nm is deposited. In all events this thickness is sufficient to fill in the voids resulting from the etching of the oxide layers of the stack 304 that was previously undertaken. This layer provides a good key for the layer of Si$_3$N$_4$ that is subsequently deposited, and also fulfils the role of a stopping layer for etching of the Si$_3$N$_4$. Then the deposition of a second layer 344 is carried out, for example a layer of silicon nitride (Si$_3$N$_4$). This deposition may be carried out using the same LPCVD deposition technique as above. A layer of silicon nitride is deposited whose thickness is typically within a range of from 20 nm to 40 nm.

The insulating regions are obtained by reactive ion etching (RIE) type etching. Anisotropic etching of layers 343 and 344 of insulating material previously deposited is carried out so as to preserve the vertical parts and to remove the horizontal parts of these layers.

The sixth step 106' may then comprise a second ion implantation (not shown). This step in particular allows higher energy doping of part of the spacer 311 and of the first gate structure 301 to be carried out, as well as of the top of the substrate (corresponding to the source and drain zones). Depending on whether it is desired to make a transistor of the PMOS or of the NMOS type, the ions are chosen in such a way as to create areas of p or n type conductivity. Thus in the case of an n-MOS transistor being created on a p-type substrate 300, a portion of the volume of the spacer 311, of the first gate structure 301 and of the source and drain sources will be n+ doped.

The sixth step 106' may then comprise an implantation annealing (not shown), also known as "activation annealing", in order to activate the doping atoms and to rectify defects due to the bombardment during the first ion implantation and/or during the second ion implantation.

It will be appreciated that the invention is not restricted to the embodiments described with reference to the figures and alternatives may be envisaged without departing from the context of the invention.

The invention claimed is:

1. A method of manufacturing a spacer for an electronic memory, the electronic memory comprising:

a substrate which extends along a reference plane;

a first gate structure deposited on the substrate, the first gate structure having at least one lateral flank;

a stack comprising a plurality of layers whereof at least one of said layers is able to store electric charges, said stack covering at least the at least one lateral flank of the first gate structure and a portion of the substrate;

said method comprising:
depositing a spacer material layer at least on an area covered by the stack;
ion beam machining the spacer material layer, said ion beam machining being carried out with controlled stopping, so as to preserve a residual portion of the thickness of the spacer material layer covering the stack;
plasma etching the residual portion of the thickness of the spacer material layer, and
following the plasma etching, second plasma etching the stack which is not covered by the spacer material after the plasma etching, said second plasma etching being carried out selectively relative to the spacer material.

2. The method according to claim 1, wherein the spacer material is doped amorphous silicon or doped polycrystalline silicon.

3. The method according to claim 1, wherein the ion beam machining is an ion beam machining with Argon.

4. The method according to claim 1, wherein the ion beam machining is carried out with an incidence of 40°.

5. The method according to claim 1, wherein the residual portion of the thickness of the spacer material layer has a thickness of between 10 nanometers and 20 nanometers.

6. The method according to claim 5, wherein the thickness is between 15 nanometers and 20 nanometers.

7. The method according to claim 1, wherein the deposition of the spacer material layer is carried out over a thickness of between $0.75*e1$ and $3*e1$, where e1 is the height of the first gate structure.

8. The method according to claim 1, wherein the second plasma etching is an etching using a fluorine-containing plasma, without Argon and diluted with Helium.

9. The method according to claim 1, wherein the plasma used during the second plasma etching is a mixture of difluoromethane, of helium and of oxygen, with twice as much helium as oxygen and four times more difluoromethane than oxygen.

10. A method of manufacturing an electronic memory cell comprising:
a substrate which extends along a reference plane;
a first gate structure deposited on the substrate, the first gate structure having at least one lateral flank;
a stack comprising a plurality of layers whereof at least one of said layers is able to store electric charges, said stack covering at least the at least one lateral flank of the first gate structure and a portion of the substrate;
a second gate structure, insulated from the first gate structure and from the substrate by the stack, the second gate structure being a spacer of the first gate structure;
said method comprising manufacturing the second gate structure, said manufacturing comprising a method for manufacturing a spacer according to claim 1.

* * * * *